United States Patent
Asami

(10) Patent No.: US 6,295,306 B1
(45) Date of Patent: Sep. 25, 2001

(54) TUNABLE SEMICONDUCTOR LASER LIGHT SOURCE

(75) Inventor: Keisuke Asami, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/119,735

(22) Filed: Jul. 21, 1998

(30) Foreign Application Priority Data

Jul. 22, 1997 (JP) .................................................... 9-195861

(51) Int. Cl.$^7$ ............................... H01S 3/10; H01S 3/098
(52) U.S. Cl. ................................. 372/20; 372/19; 372/23
(58) Field of Search .................................... 372/6, 19, 20, 372/23, 32, 96, 101, 102, 105; 385/37, 33–36, 38; 359/327; 356/332

(56) References Cited

U.S. PATENT DOCUMENTS

| | | | |
|---|---|---|---|
| 3,907,430 | * 9/1975 | Mann | 356/332 |
| 4,063,106 | * 12/1977 | Ashkin et al. | 359/327 |
| 5,159,601 | * 10/1992 | Huber | 372/6 |
| 5,263,037 | * 11/1993 | Trutna, Jr. et al. | 372/20 |
| 5,323,404 | * 6/1994 | Grubb | 372/6 |
| 6,091,744 | * 7/2000 | Sorin et al. | 372/20 |

\* cited by examiner

*Primary Examiner*—Quyen P. Leung
(74) *Attorney, Agent, or Firm*—Pillsbury Winthrop LLP

(57) ABSTRACT

A semiconductor laser light source tunable in wavelength comprising: a semiconductor laser which has one facet having an antireflection coating; a tunable bandpass filter for transmitting a light having a specific wavelength from wavelength components of output light out of the one facet having the antireflection coating of the semiconductor laser; and a fiber grating member for receiving the transmitted light from the tunable band pass filter and for reflecting a light of the specific wavelength. Preferably, as the fiber grating member, a compound fiber bragg grating which comprises a plurality of fiber gratings connected in series, each of which receives transmitted light from the tunable band pass filter and reflects only an individual wavelength different from one another, is used.

9 Claims, 5 Drawing Sheets

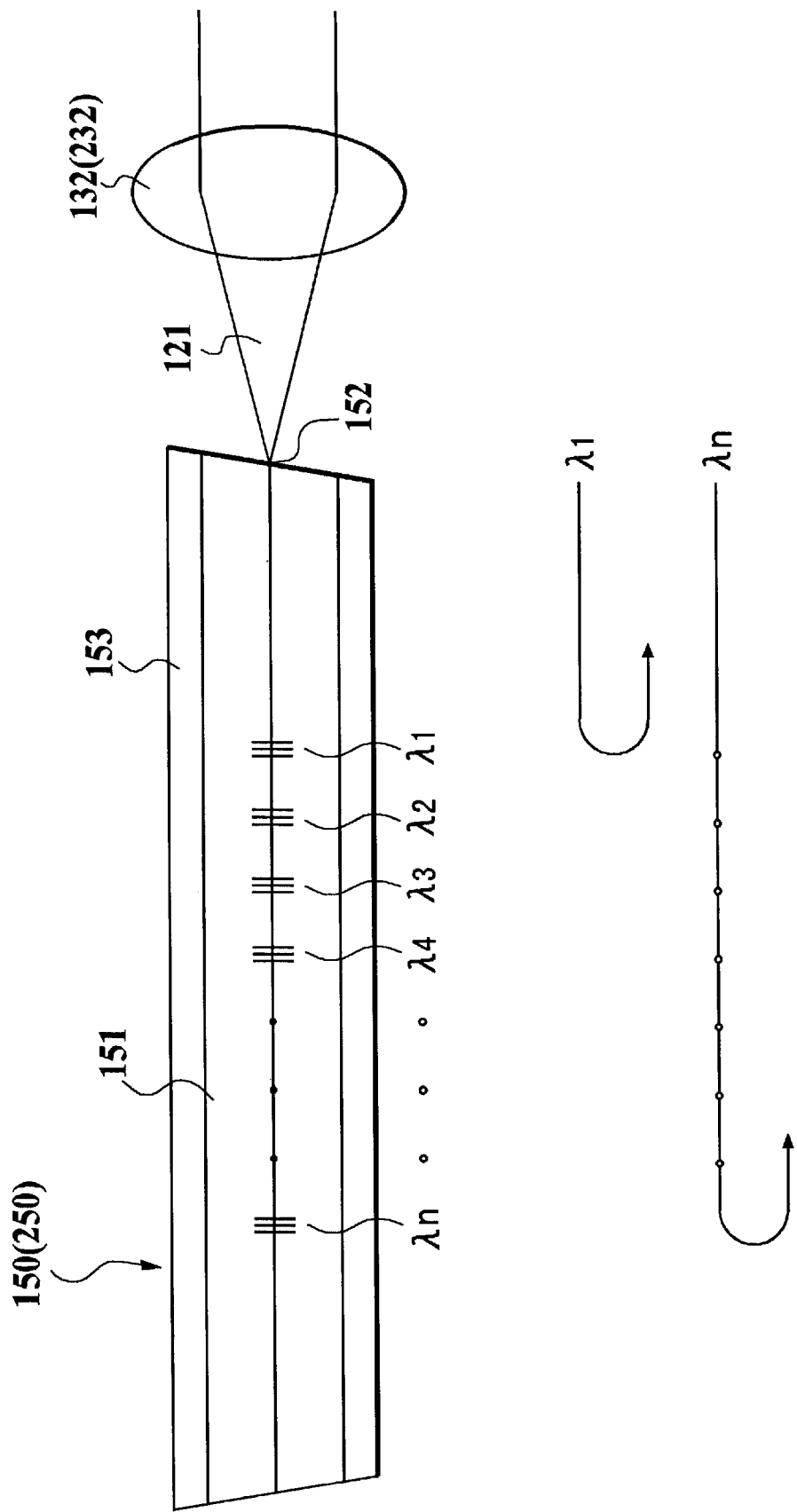

TRANSMISSION CHARACTERISTICS OF BANDPASS FILTER

REFLECTION CHARACTERISTICS OF FIBER GRATING

WAVELENGTH CHARACTERISTICS OF LIGHT FED-BACK TO LD

TUNABLE SEMICONDUCTOR LASER LIGHT SOURCE

BACKGROUND OF THE INVENTION

1. Field of the Invention

The present invention relates to a semiconductor laser light source tunable in wavelength (hereinafter, a semiconductor laser may be simply referred to LD) for obtaining a specific reference wavelength which is used in the field of optical communication, in particular, for WDM (Wavelength Division Multiplex) transmission or the like, and relates to a tunable LD laser light source using a fiber grating as a wavelength selecting means.

2. Description of the Earlier Development

It is known that in a Fabry-Perot type of resonator which has one facet of an LD, having an antireflection coating through which a wavelength selected by using an element having a wavelength selection property is fed back into the LD and which has the other facet for forming an external resonator together with the one facet, a laser oscillation is carried out when the gain condition and the phase condition overcome a loss such as a scattering loss and the like.

As described above, a tunable LD light source is formed by selecting a laser beam having a desired wavelength from the output beam of the laser-oscillating LD, and thereafter by feeding it back into the LD.

Recently, such a tunable LD light source comes to be an indispensable one in the WDM transmission system which attracts public attention as a large capacity transmission technology in an optical communication network, which is required with tendency to use multimedia.

An earlier LD light source tunable in wavelength will be explained with reference to FIG. 5, as follows.

FIG. 5 shows an example of construction of an earlier tunable LD light source.

In the earlier example shown in FIG. 5, one of the facets of the LD 10 has a cloven surface 11 and the other of the facets has an antireflection coating 12 provided thereon.

The light beam outputting through the side of the antireflection coating 12 of the LD 10 is changed to a parallel beam through a lens 31. In front of the lens 31, a total reflection mirror 50 is arranged through a tunable bandpass filter 40. The total reflection mirror 50 and the cloven surface 11 of the LD, which has a low reflection coating thereon form an external resonator.

In front of the cloven surface 11 of the LD 10, a lens 33 is arranged. The laser beam transmitted through the lens 33 is transmitted through an optical fiber 60 and is output out of an output port 11.

Next, the operation of the tunable LD light source shown in FIG. 5 will be explained, as follows.

The light beam emitted from the side of the antireflection coating 12 of the LD 10 is changed to a parallel beam through the lens 31, and then is directed to a tunable bandpass filter 40 to transmit only a light beam having a specific wavelength. Thereafter, the light beam is reflected by the total reflection mirror 50 to change the advancing direction thereof 180° and passes through the tunable band pass filter 40 and the lens 31 again, and directs back to (is fed back to) the LD 10. The light beam directed to the LD 10 is reflected by the cloven surface 11 having a reflectance of several tens of % and is returned to the LD 10 again.

A laser oscillation is carried out in the external resonator which is constituted by the cloven surface 11 and the total reflection mirror 50. The tunable band pass filter 40 of very narrow bandwidth, i.e., having a bandwidth (FWHM, i.e., Full width half maximum) of the transmission range of about 0.5 nm, is used.

Thus, the light beam obtained by laser oscillation is coupled to the optical fiber 60 through the lens 33 to enter the output port 61. In such a construction, a tunable LD light source can be made by making the transmission wavelength of the tunable band pass filter 40 changeable.

However, because such an earlier LD light source tunable in wavelength shown in FIG. 5 used only a tunable bandpass filter 40 as a wavelength selection means and required a narrow bandwidth (FWHM) of the transmission range of the filter. As a result, the cost for the tunable band pass filter 40 was very high and about 0.5 nm was the upper limit of the bandwidth (FWHM) of the transmission range of the tunable band pass filter 40. According to an earlier tunable LD light source, it was difficult to obtain a laser oscillation having a narrow spectral width.

Because high-precision control for the tilt angle of the tunable band pass filter 40 to the incident light beam and for the temperature thereof were required in order to enhance the repeatability of selected wavelength, such an earlier tunable LD light source had the disadvantages in a productional aspect in that a complicated structure, a high optical axis adjustment technique and a high mounting technique were required.

SUMMARY OF THE INVENTION

The present invention was developed in view of these problems. It is therefore an object of the present invention to provide an LD light source tunable in wavelength, which has a simple structure and a high reliability, and which provides a stable laser oscillation of light having a narrow spectral width and gives a high productivity.

In order to solve the above problem, in accordance with an aspect of the invention, the semiconductor laser light source tunable in wavelength comprising: a semiconductor laser which has one facet having an antireflection coating; a tunable bandpass filter for transmitting a light having a specific wavelength from wavelength components of output light out of the one facet having the antireflection coating of the semiconductor laser; and a fiber grating member for receiving the transmitted light from the tunable band pass filter and for reflecting a light of the specific wavelength.

According to the tunable semiconductor laser light source having such a structure, after selecting a light beam having a specific wavelength from the beam emitted out of the facet having the antireflection coating of the LD, by the tunable band pass filter, the selected light beam is further narrowly selected in wavelength by the fiber grating member and the light beam of narrowed bandwidth progresses backward to be fed back into the LD, so that a laser oscillation is carried out.

Therefore, the tunable semiconductor laser light source of the present invention enables excellent wavelength selection and an oscillation of laser light beam having a narrow spectral width.

The fiber grating has a wavelength selection property of narrower bandwidth, in comparison with the tunable band pass filter in the two wavelength selection elements, and therefore has a high stability in wavelength to temperature change and enables relaxation of control accuracy for the incident angle to the tunable band pass filter and for the temperature thereof. According to the laser light source of the invention, it is possible to set the bandwidth (FWHM) of the transmission range of the tunable band pass filter larger than 0.5 nm, up to about 2 nm. As the result, the tunable semiconductor laser light source according to the invention does not require a complicated structure, a high optical axis adjustment technique, nor a high mounting technique.

In accordance with another aspect of the invention, the semiconductor laser light source tunable in wavelength comprising: a semiconductor laser which has one facet having an antireflection coating; a tunable bandpass filter for transmitting a light having a specific wavelength from wavelength components of output light out of the one facet having the antireflection coating of the semiconductor laser; and a plurality of fiber gratings connected in series, each of which receives transmitted light from the tunable band pass filter and reflects only an individual wavelength different from one another.

The plurality of fiber gratings may be a compound fiber bragg grating in which a plurality of gratings are arranged to connect to one another in series, each of which reflects only an individual wavelength different from one another, from the light transmitted through the band pass filter, and also may be a plurality of individual fiber gratings which are connected in series.

According to such a structure, because both the tunable bandpass filter and the plurality of fiber gratings can change the wavelength to be selected, it is possible to obtain a completely tunable semiconductor laser light source without changing a fiber grating for another one.

Preferably, the tunable semiconductor laser light source further comprises; an optical fiber for receiving an output light out of the other facet of the semiconductor laser, and an output port for taking the received light out of the optical fiber.

According to the tunable semiconductor laser light source having such a structure, it is possible to introduce the output light beam emitted from the other facet of the LD, into the optical fiber and to take the light beam introduced into the optical fiber out of the output port.

The tunable semiconductor laser light source may further comprises; a lens for collimating the output light out of the one facet having the antireflection coating of the semiconductor laser; a lens for coupling the transmitted light through the tunable band pass filter to the plurality of fiber gratings; and a lens for coupling the output light out of the other facet of the semiconductor laser to the optical fiber.

According to the tunable semiconductor laser light source having such a structure, it is possible to direct the output light beam emitted from the facet having the antireflection coating of the LD, to the tunable band pass filter after collimating the output light beam through a lens, and then to surely couple the light beam transmitted through the tunable band pass filter into the fiber grating member by focussing the transmitted light beam on an incident end surface of the fiber grating member by using a lens.

Because of providing a lens for coupling the output light emitted out of the other facet of the LD to the optical fiber, it is possible to surely couple the output light beam emitted from the other facet of the LD into the optical fiber by focussing the light beam by using the lens.

Preferably, the angle of the tunable band pass filter to an optical axis is adjustable to change the wavelength to be selected thereby.

In accordance with another aspect of the invention, the semiconductor laser light source tunable in wavelength comprising: a semiconductor laser which has one facet having an antireflection coating and the other facet having a coating with high reflectivity; a beam splitter for separating a light beam emitted from the one facet having the antireflection coating in two portions and for directing one of the two portions onto a tunable bandpass filter; the tunable band pass filter for transmitting a light beam having a specific wavelength from wavelength components of the one portion of light beam from the beam splitter; and a plurality of fiber gratings connected in series, each of which receives transmitted light from the tunable band pass filter and reflects only an individual wavelength different from one another.

According to the tunable semiconductor laser light source having such an above structure, because on the other facet of LD, a coating with high reflectivity is formed, and the external resonator is constituted by using a portion of light beam out of the one facet having the antireflection coating of the LD, an optical system is not required in the side of the other surface of the LD on which a coating with high reflectivity is formed.

Accordingly, it is possible to further simplify the structure of the tunable semiconductor laser light source and consequently, to easily contain the LD chip in a can package and to enhance the reliability thereof.

Because the LD light source further comprise an optical fiber for receiving the other of the light beam separated through the beam splitter, and an output port for taking the received light beam out of the optical fiber, it is possible to introduce the other of the light beam separated through the beam splitter into the optical fiber, and to take the light beam introduced into the optical fiber, out of the output port.

The tunable semiconductor laser light source may further comprises; a lens for collimating the output light out of the one facet having the antireflection coating of the semiconductor laser; a lens for coupling a light transmitted through the tunable band pass filter, into the fiber grating member; and a lens for coupling the other of the light separated through the beam splitter into the optical fiber.

According to the tunable semiconductor laser light source having such an above structure, it is possible to direct the output light beam emitted from the facet having the antireflection coating of the LD, to the tunable band pass filter after collimating the output light beam through a lens, and then to surely couple the light beam transmitted through the tunable band pass filter into the fiber grating member by focussing the transmitted light beam on an incident end surface of the fiber grating member by using a lens.

Because of providing a lens for coupling the other of the light beam separated through the beam splitter into the optical fiber, it is possible to surely couple the other of the light separated through the beam splitter into the optical fiber by focussing the light beam by using the lens.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIG. 3 is a view for explaining the construction and function of a compound fiber bragg grating which is one of the component parts of the present invention;

FIGS. 4A to 4C show wavelength characteristics of light fed-back to the tunable LD light source, wherein FIG. 4A is a wavelength characteristics view of light transmitted through the tunable band pass filter when a wavelength of $\lambda_2$ is selected through the band pass filter, FIG. 4B is a view showing filtering (reflection) characteristics of the compound fiber bragg grating, and FIG. 4C is a wavelength characteristics view of light fed-back to LD after the transmission wavelength of the compound fiber bragg grating was selected to have a narrow bandwidth by the compound fiber bragg grating.

PREFERRED EMBODIMENT OF THE INVENTION

Embodiments of the tunable LD light source according to the present invention will be explained with reference to FIGS. 1 to 4C, as follows.

First Embodiment

Figure 1:
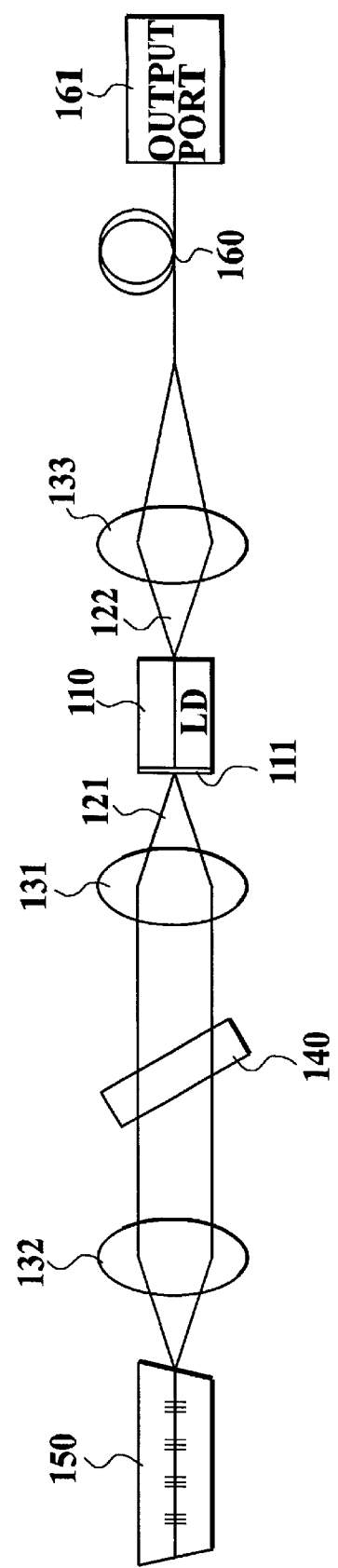
FIG. 1 is a simplified view showing a construction of the tunable LD light source according to a first embodiment of the present invention.

FIG. 1 is a simplified view showing a construction of the tunable LD light source according to a first embodiment of the present invention.

In this Figure, an antireflection coating 111 having a reflectance of not more than 0.1% is provided on the back end surface of an LD 110. The front end has a cloven surface having a reflectance of about 30%, like the earlier LD light source.

A light beam 121 emitted from the back end surface, that is, from the antireflection coating 111, of the LD 110 is collimated through a lens 131 and directs to a tunable bandpass filter 140. The bandwidth (FWHM) of the transmission range of the tunable band pass filter 140 may be 1 nm to 2 nm.

Only a light beam having a specific wavelength $\lambda a$ from the whole wavelength components of the beam directed to the tunable band pass filter 140 can be transmitted through the band pass filter 140 and is thereafter coupled into a fiber grating member (compound fiber bragg grating) 150 through a lens 132. The wavelength to be transmitted through the tunable band pass filter 140 can be changed by changing the angle of the band pass filter to the optical axis. The angle of the tunable band pass filter 140 can be adjusted by a precise rotation thereof around an axis perpendicular to the optical axis, for example, by using a precise motor or the like.

The fiber grating member 150 may be a single fiber grating for reflecting only a narrow bandwidth containing the wavelength to be selected. In order to obtain a semiconductor laser light source tunable in wavelength without changing a fiber grating for another one, it is preferable to use a compound fiber bragg grating as the fiber grating member, in which a plurality of gratings are arranged to connect to one another in series, each of which reflects only an individual wavelength different from one another. Although the plurality of fiber gratings preferably constitute a compound fiber bragg grating, it is not necessarily required to be formed as a body.

The beam coupled into the compound fiber bragg grating 150 is changed to have a narrower band by diffraction gratings which are formed in the fiber, and is retroreflected to return to the LD 110 by passing through the lens 132, the tunable band pass filter 140, and the lens 131 again.

Thus, a laser oscillation is carried out by the external resonator which is formed by the front end surface (cloven surface) of the LD 110 and each of the diffraction gratings in the compound fiber bragg grating 150.

The compound fiber bragg grating 150 will be explained in detail with reference to FIGS. 3 and 4A to 4C.

FIG. 3 shows a detailed structure of the compound fiber bragg grating 150.

In FIG. 3, the compound fiber bragg grating 150 comprises a fiber grating body 151 having an incident end surface 152 and a plurality of diffraction gratings formed therein, and a protection tube 153 made of silica which has a coordinate coefficient of thermal expansion with the fiber grating.

That is, the plurality of diffraction gratings formed in the compound fiber bragg grating 150 reflect only the specific wavelengths $\lambda 1, \lambda 2, \lambda 3 \ldots$ and $\lambda n$, respectively and transmit all of wavelengths other than the specific ones through the compound fiber bragg grating 150. Each of the specific wavelengths $\lambda 1, \lambda 2, \lambda 3 \ldots$ and $\lambda n$ is set to a reference wavelength which is used for WDM transmission, and the like.

Although the WDM transmission requires an individual selection of a reference wavelength from the specific wavelengths, it does not require a continuous tuning in wavelength.

Next, the function in the case of selecting a wavelength $\lambda 1$ through the tunable band pass filter 140 will be explained, as follows.

The light beam selected through the tunable band pass filter 140 is collected through the lens 132 and is coupled into the fiber grating body 151. The incident end surface 152 of the fiber grating body 151 is processed to have a tilt with respect to the normal to the optical axis and polished surface to prevent a light from unnecessary returning to the LD 110.

The light beam entered the fiber grating body 151 is further wavelength-selected by a specific grating for selecting a wavelength of $\lambda 1$ among the diffraction gratings which are formed in the fiber, that is, the bandwidth to be reflected is narrowed by one of selection wavelength $\lambda 1$. The light beam having a wavelength $\lambda 1$ reflected by the specific diffraction grating progresses backward to be fed back into the LD 110 through the lens 132, the tunable band pass filter 140, and the lens 131. Thus, an laser oscillation is performed by the external resonator.

Similarly, when changing the incident angle to the tunable band pass filter 140 to select another wavelength $\lambda n$, the light beam entered the fiber grating body 151 passes through the diffraction gratings for selecting wavelengths of $\lambda 1, \lambda 2, \lambda 3, \ldots$ and is thereafter wavelength-selected by a specific one for selecting a wavelength of $\lambda n$, that is, the bandwidth to be selected is narrowed by the one of selection wavelength $\lambda n$. The light beam having a wavelength $\lambda n$ reflected by the specific diffraction grating progresses backward to be fed back into the LD 110.

When the wavelength to be selected by the tunable band pass filter 140 does not coincide with any one of those of the diffraction gratings in the fiber grating body 151, all of wavelengths pass through all of the diffraction gratings as it is, to go through the fiber grating body 151.

In a case of requiring no return of wavelength, preferably, also the rear end surface of the fiber grating body 151 is processed to have a tilt and polished surface.

Because a fiber grating has a characteristics in general that although fluctuations of wavelength with the change of temperature is small, i.e., not more than 0.01 nm/°C., fluctuations of wavelength with strain caused by bending and the like is large, the compound fiber bragg grating 150 has a structure in that a thin fiber grating body 151 is contained in the protection tube 153 made of silica or the like which has a coefficient of thermal expansion near that of the fiber grating body 151.

Figure 4A:
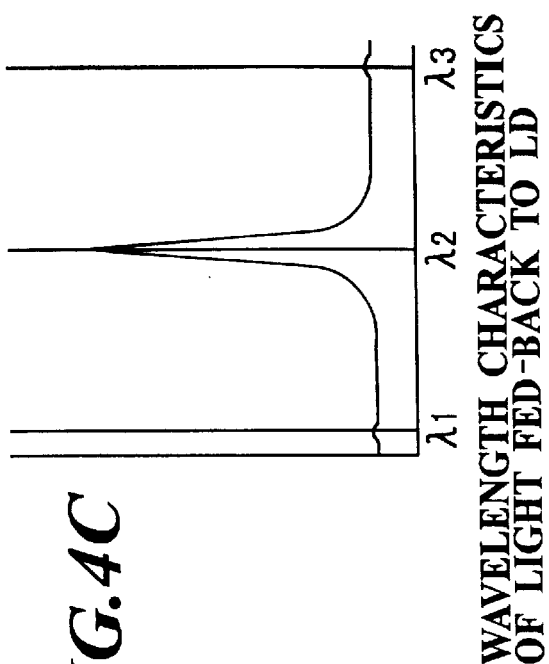
Figure 4B:
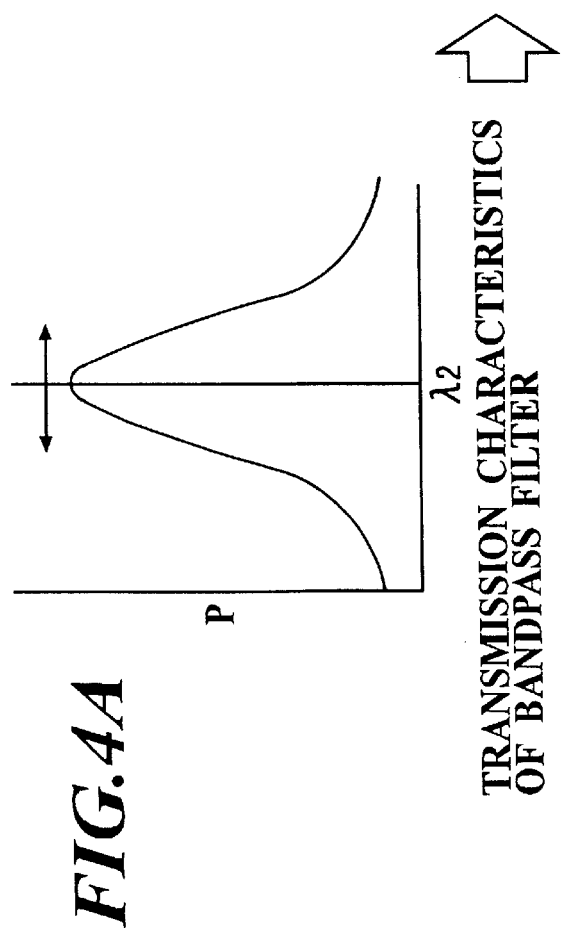
Figure 4C:
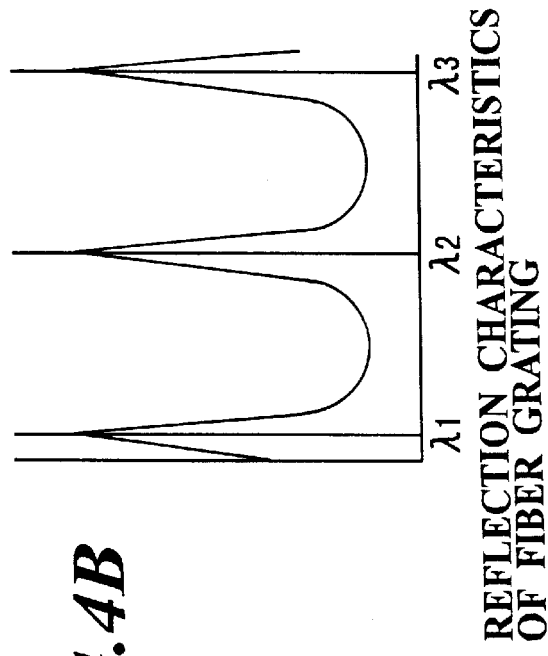
Figure 5:
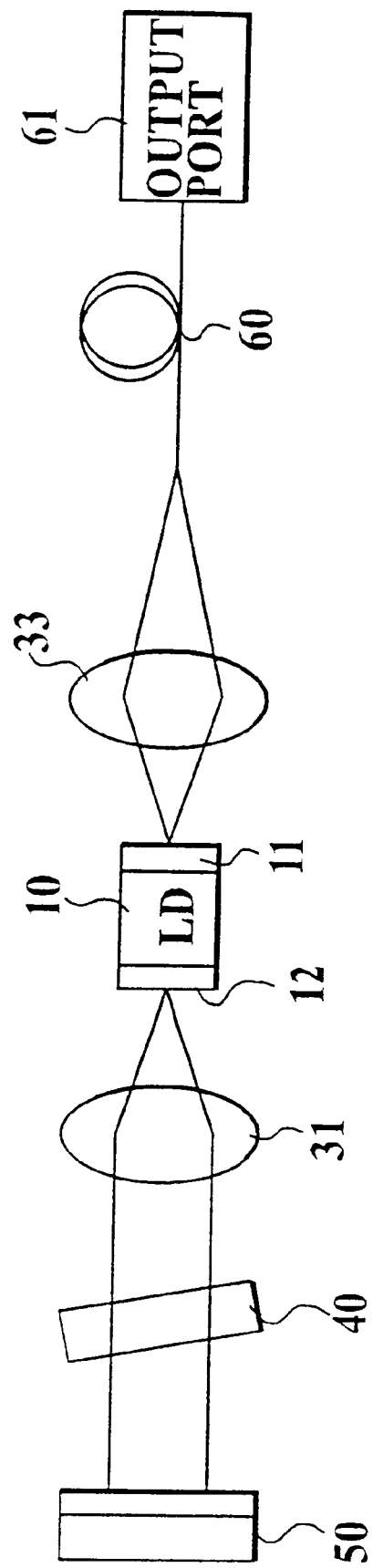
FIG. 5 is a simplified view showing a construction of an earlier tunable LD light source.

FIGS. 4A to 4C show the wavelength characteristics of light fed-back to the tunable LD light source, wherein FIG. 4A is a wavelength characteristics view of light transmitted through the tunable band pass filter 140 when a wavelength of $\lambda_2$ is selected in the band pass filter 140, FIG. 4B is a view showing filtering (reflection) characteristics of the compound fiber bragg grating 150, and FIG. 4C is a wavelength characteristics view of light fed-back to LD 110 after the transmission wavelength of the compound fiber bragg grating 150 was selected to have a narrow bandwidth by the compound fiber bragg grating 150.

In FIG. 1, the light beam generated by such a laser oscillation is output from the front end surface, i.e., a cloven surface, of the LD 110 to couple into the optical fiber 160 through the lens 133 and is taken out of the output port 161.

Second Embodiment

Figure 2:
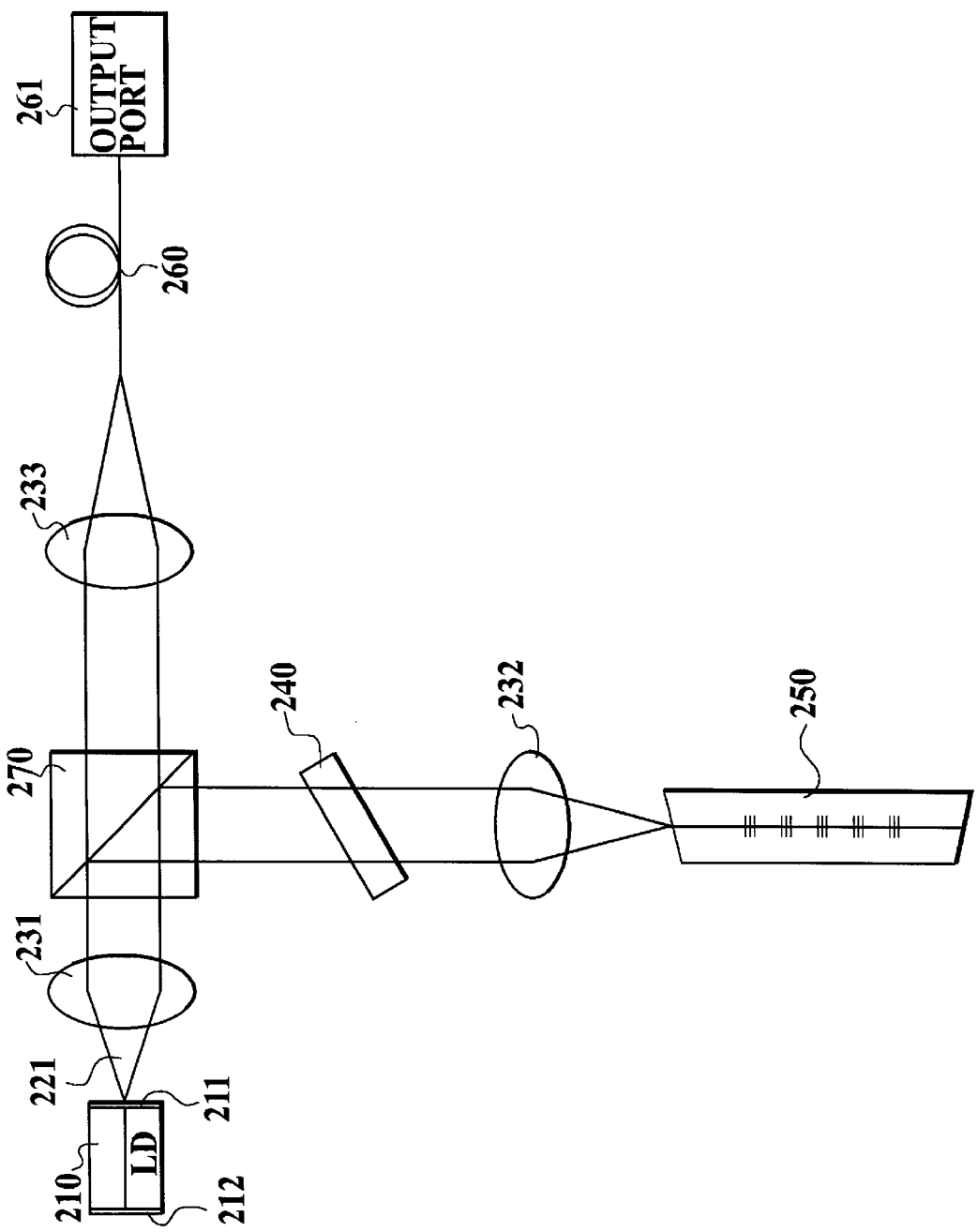
FIG. 2 is a simplified view showing a construction of the tunable LD light source according to a second embodiment of the present invention.

FIG. 2 is a simplified view showing a construction of the tunable LD light source according to the second embodiment of the present invention.

In this Figure, a coating 212 having a high reflectance is provided on the back end surface of an LD 210 and an antireflection coating 211 is provided on the front end surface thereof.

The light beam 221 emitted out of the front end surface of the LD 210 is collimated through a lens 231 and is split into a ratio of 50:50 by a beam splitter 270. With respect to splitting ratio of the beam splitter 270, an increase of the optical output requires an increase of the splitting ratio for the side of the optical fiber 260, and an expansion of the changeable width of wavelength requires an increase of the splitting ratio for the side of the tunable band pass filter 240.

Thus, a portion of the light beam incident upon the beam splitter 270 is reflected thereby to couple into the compound fiber bragg grating 250 through the tunable band pass filter 240 and the lens 232.

The wavelength of beam selected by the tunable band pass filter 240 and the compound fiber bragg grating 250 is returned to the way it has come and is fed back into the LD 210, like the first embodiment shown in FIG. 1. Thus, an laser oscillation is performed by the external resonator which is constituted by the coating 212 having a high reflectance, which is provided on the back end surface of the LD 210, and the diffraction gratings in the compound fiber bragg grating 250.

A portion of the light beam incident upon the beam splitter 270 transmits through the splitter 270 to couple into the optical fiber 260 through the lens 233 and is taken out of the output port 261.

The present invention is not limited to the above-described embodiments. For example, another arrangement of parts may be adopted.

Further, with respect to detailed parts of other structures, the structures may be suitably modified, as a matter of course.

As has been explained in the foregoing, according to the tunable semiconductor laser light source of the present invention, because after selecting a light beam having a specific wavelength from the beam emitted out of the facet having the antireflection coating of the LD, by the tunable band pass filter, the selected light beam is further narrowly selected in wavelength by the fiber grating member and the light beam of narrowed bandwidth progresses backward to be fed back into the LD, so that a laser oscillation is carried out.

Therefore, the tunable semiconductor laser light source of the present invention enables excellent wavelength selection and an oscillation of laser light beam having a narrow spectral width.

The fiber grating has a wavelength selection property of narrower bandwidth, in comparison with the tunable band pass filter in the two wavelength selection elements, and therefore has a high stability in wavelength to temperature change and enables relaxation of control accuracy for the incident angle to the tunable band pass filter and for the temperature thereof. According to the laser light source of the invention, it is possible to set the bandwidth (FWHM) of the transmission range of the tunable band pass filter larger than 0.5 nm, up to about 2 nm. As the result, the tunable semiconductor laser light source according to the invention does not require a complicated structure, a high optical axis adjustment technique, nor a high mounting technique.

When using a plurality of fiber gratings connected in series, each of which receives transmitted light from the tunable band pass filter and reflects only an individual wavelength different from one another, as the fiber grating member, because both the tunable bandpass filter and the plurality of fiber gratings can change the wavelength to be selected, it is possible to obtain a completely tunable semiconductor laser light source without changing a fiber grating for another one.

What is claimed is:

1. A semiconductor laser light source tunable in wavelength comprising:
    a semiconductor laser which has one facet having an antireflection coating;
    a tunable bandpass filter for transmitting a light having a specific wavelength from wavelength components of output light out of the one facet having the antireflection coating of the semiconductor laser; and
    a plurality of fiber gratings connected in series, each of which receives transmitted light from the tunable band pass filter and reflects only an individual wavelength different from one another.

2. A semiconductor laser light source tunable in wavelength as claimed in claim 1, further comprising; an optical fiber for receiving an output light out of the other facet of the semiconductor laser, and an output port for receiving the light out of the optical fiber to take it out.

3. A semiconductor laser light source tunable in wavelength as claimed in claim 2, further comprising;
    a lens for collimating the output light out of the one facet having the antireflection coating of the semiconductor laser;
    a lens for coupling the transmitted light through the tunable band pass filter to the plurality of fiber gratings; and
    a lens for coupling the output light out of the other facet of the semiconductor laser to the optical fiber.

4. A semiconductor laser light source tunable in wavelength as claimed in claim 1, wherein the plurality of fiber gratings are arranged to form a compound fiber bragg grating.

5. A semiconductor laser light source tunable in wavelength as claimed in claim 4, wherein an incident end surface of the compound fiber bragg grating is processed to have a tilt with respect to the normal to the optical axis.

6. A semiconductor laser light source tunable in wavelength comprising:
    a semiconductor laser which has one facet having an antireflection coating and the other facet having a coating with high reflectivity;
    a beam splitter for separating a light beam emitted from the one facet having the antireflection coating in two portions and for directing one of the two portions onto a tunable bandpass filter;

the tunable band pass filter for transmitting a light beam having a specific wavelength from wavelength components of the one portion of light beam from the beam splitter; and a plurality of fiber gratings connected in series, each of which receives transmitted light from the tunable band pass filter and reflects only an individual wavelength different from one another.

7. A semiconductor laser light source tunable in wavelength as claimed in claim 6, further comprising;

a lens for collimating the output light beam out of the one facet having the antireflection coating of the semiconductor laser;

a lens for coupling a light beam transmitted through the tunable band pass filter, into the fiber gratings; and a lens for coupling the other of the light beam separated through the beam splitter into the optical fiber.

8. A semiconductor laser light source tunable in wavelength as claimed in claim 6; wherein bandwidth (Full width half maximum) in the transmission range of the tunable band pass filter is more than 0.5 nm and not more than 2 nm.

9. A semiconductor laser light source tunable in wavelength as claimed in claim 6; wherein an angle of the tunable band pass filter to an optical axis is adjustable.

* * * * *